(12) United States Patent  
Kondo et al.

(10) Patent No.: US 11,502,016 B2  
(45) Date of Patent: Nov. 15, 2022

(54) POWER AMPLIFIER MODULE

(71) Applicant: Murata Manufacturing Co., Ltd., Kyoto-fu (JP)

(72) Inventors: Masao Kondo, Nagaokakyo (JP); Masahiro Shibata, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 206 days.

(21) Appl. No.: 17/081,833

(22) Filed: Oct. 27, 2020

(65) Prior Publication Data

US 2021/0043535 A1 Feb. 11, 2021

Related U.S. Application Data

(63) Continuation of application No. 16/153,310, filed on Oct. 5, 2018, now Pat. No. 10,847,436.

(30) Foreign Application Priority Data

Oct. 11, 2017 (JP) .................. 2017-197352  
Jul. 2, 2018 (JP) .................. 2018-125927

(51) Int. Cl.
  *H01L 23/367* (2006.01)
  *H01L 29/737* (2006.01)
  (Continued)

(52) U.S. Cl.
  CPC ...... *H01L 23/367* (2013.01); *H01L 23/49811* (2013.01); *H01L 24/16* (2013.01); *H01L 29/0649* (2013.01); *H01L 29/41708* (2013.01); *H01L 29/7371* (2013.01); *H03F 1/302* (2013.01); *H03F 3/195* (2013.01); *H03F 3/21* (2013.01); *H03F 3/213* (2013.01); *H01L 24/13* (2013.01); *H01L 2224/13147* (2013.01); *H03F 2200/267* (2013.01); *H03F 2200/451* (2013.01)

(58) Field of Classification Search
  CPC ..... H01L 23/367–3677; H01L 29/7371–7378; H01L 29/41708
  See application file for complete search history.

(56) References Cited

U.S. PATENT DOCUMENTS 5,373,185 A    12/1994   Sato

FOREIGN PATENT DOCUMENTS

JP     H06-104275 A    4/1994
JP     2003-077930 A   3/2003

OTHER PUBLICATIONS

English Translation of Honma (JP 2003-077930), translated on Nov. 19, 2019.

*Primary Examiner* — Amar Movva  
(74) *Attorney, Agent, or Firm* — Studebaker & Brackett PC

(57) ABSTRACT

A power amplifier module includes a substrate including, in an upper surface of the substrate, an active region and an element isolation region. The power amplifier module further includes a collector layer, a base layer, and an emitter layer that are stacked on the active region; an interlayer insulating film that covers the collector layer, the base layer, and the emitter layer; a pad that is thermally coupled to the element isolation region; and an emitter bump that is disposed on the interlayer insulating film, electrically connected to the emitter layer through a via hole provided in the interlayer insulating film, and electrically connected to the pad. In plan view, the emitter bump partially overlaps an emitter region which is a region of the emitter layer and through which an emitter current flows.

6 Claims, 16 Drawing Sheets

(51) Int. Cl.
*H01L 29/417* (2006.01)
*H01L 23/498* (2006.01)
*H01L 23/00* (2006.01)
*H03F 3/21* (2006.01)
*H03F 1/30* (2006.01)
*H01L 29/06* (2006.01)
*H03F 3/213* (2006.01)
*H03F 3/195* (2006.01)

POWER AMPLIFIER MODULE

CROSS-REFERENCE TO RELATED APPLICATIONS

This application is a Continuation of U.S. patent application Ser. No. 16/153,310 filed Oct. 5, 2018 which claims benefit of priority to Japanese Patent Application No. 2017-197352, filed Oct. 11, 2017, and to Japanese Patent Application No. 2018-125927, filed Jul. 2, 2018, the entire contents of both are incorporated herein by reference.

BACKGROUND

Technical Field

The present disclosure relates to a power amplifier module, and in particular, to a power amplifier module suitable for a transmission system of cellular phones and the like.

Background Art

During the operation of a power amplifier module, self-heating occurs in transistors, and the performance of the power amplifier module decreases with an increase in the temperature of the transistors. In order to suppress the decrease in the performance, it is desirable to efficiently dissipate heat from a heat-generating source of the transistors to the outside of the power amplifier module. In a configuration in which a semiconductor chip including the transistors is mounted on a printed circuit board with bumps therebetween, heat dissipation is performed through thermal paths from the transistors through the bumps to the printed circuit board.

Japanese Unexamined Patent Application Publication No. 2003-77930 discloses a semiconductor device in which heat dissipation characteristics are improved by shortening a heat-dissipation path. This semiconductor device includes a heterojunction bipolar transistor (HBT). An emitter electrode is disposed on an emitter region of the HBT. An emitter wiring line is disposed on the emitter electrode with a first-layer interlayer insulating film therebetween. The emitter wiring line is connected to the emitter electrode through an opening provided in the first-layer interlayer insulating film. An emitter main electrode terminal is disposed on the emitter wiring line with a second-layer interlayer insulating film therebetween. The emitter main electrode terminal is connected to the emitter wiring line through an opening provided in the second-layer interlayer insulating film. A bump electrode is provided on the emitter main electrode terminal.

In this HBT, a thermal path from an emitter layer to the bump electrode through the emitter electrode, the emitter wiring line, and the emitter main electrode terminal functions as a heat-dissipation path for dissipating heat generated from the HBT. Since the emitter layer, the emitter electrode, the emitter wiring line, the emitter main electrode terminal, and the bump electrode are stacked in this order in a thickness direction of a substrate, this configuration is advantageous in that the heat-dissipation path is shorter than that in a configuration in which heat is dissipated in a lateral direction of a substrate.

SUMMARY

In the HBT disclosed in Japanese Unexamined Patent Application Publication No. 2003-77930, the sectional areas of heat-dissipation paths that connect an emitter, a base, and a collector to corresponding bump electrodes are restricted by the areas of the emitter, the base, and the collector, respectively. For example, the sectional area of the heat-dissipation path in the portion of the opening provided in the first-layer interlayer insulating film for connecting the emitter electrode to the emitter wiring line cannot be larger than the area of the emitter electrode. Thus, it is difficult to unconditionally increase the sectional areas of the heat-dissipation paths. Therefore, it is difficult to sufficiently reduce the thermal resistance of the thermal paths from the HBT to the bump electrodes.

Accordingly, the present disclosure provides a power amplifier module in which heat-dissipation efficiency can be enhanced by increasing the sectional area of a heat-dissipation path without being subjected to the restriction of the areas of an emitter, a base, and a collector.

A power amplifier module according to a preferred embodiment of the present disclosure includes a substrate including, in an upper surface of the substrate, an electrically conductive active region and an insulating element isolation region adjacent to the active region. The power amplifier module further includes a collector layer, a base layer, and an emitter layer that are sequentially stacked on the active region; an interlayer insulating film that covers the collector layer, the base layer, and the emitter layer; a pad that is thermally coupled to the element isolation region; and an emitter bump that is disposed on the interlayer insulating film, electrically connected to the emitter layer through a via hole provided in the interlayer insulating film, and electrically connected to the pad. In plan view, the emitter bump partially overlaps an emitter region which is a region of the emitter layer and through which an emitter current flows.

Since the pad and the emitter bump are electrically connected to each other, the thermal resistance of the thermal path from the pad to the emitter bump is lower than that in the configuration in which the pad and the emitter bump are connected to each other with an insulating layer therebetween. This configuration forms a heat-dissipation path through which heat generated in a heat-generating source of the collector layer, the base layer, and the emitter layer is conducted to the pad through the substrate and further conducted from the pad to the emitter bump. This heat-dissipation path is added to a heat-dissipation path formed in a region where the emitter bump overlaps the emitter region. Thus, the substantial sectional area of heat-dissipation paths is increased. As a result, the heat-dissipation efficiency can be enhanced.

Other features, elements, characteristics and advantages of the present disclosure will become more apparent from the following detailed description of preferred embodiments of the present disclosure with reference to the attached drawings.

DETAILED DESCRIPTION

First Embodiment

A power amplifier module according to a first embodiment will be described with reference to FIGS. 1A and 1B.

Figure 1A:
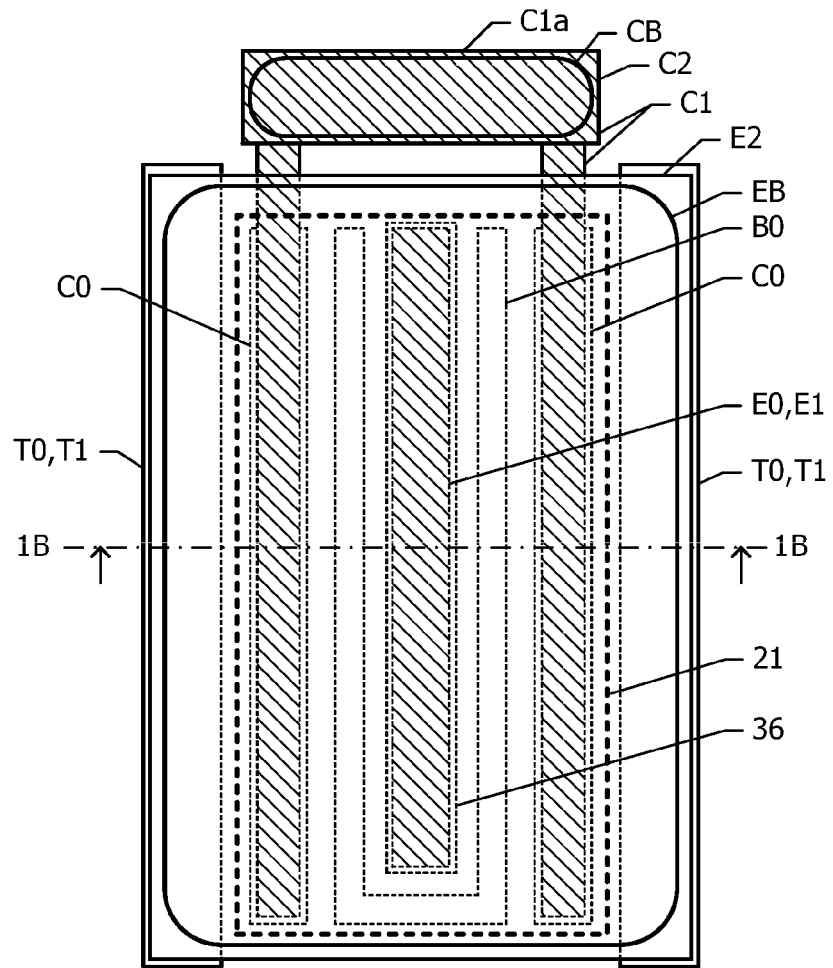
FIG. 1A is a plan view of an emitter electrode, a base electrode, and a collector electrode that are formed of metal and respectively connected to an emitter layer, a base layer, and a collector layer of a transistor of a power amplifier module according to a first embodiment and wiring lines that are formed of metal and disposed above the electrodes.

FIG. 1A is a plan view of an emitter electrode, a base electrode, and a collector electrode that are formed of metal and respectively connected to an emitter layer, a base layer, and a collector layer of a transistor included in a power amplifier module according to the first embodiment and wiring lines that are formed of metal and disposed above the electrodes. In FIG. 1A, a first-layer emitter wiring line E1 and a first-layer collector wiring line C1 are hatched.

A base electrode B0 having a planar horseshoe shape (U shape) is disposed so as to sandwich, in a width direction, an emitter electrode E0 having a planar shape (for example, a rectangular shape) that is long in one direction (the longitudinal direction in FIG. 1A). For example, the base electrode B0 is disposed on both sides of the emitter electrode E0 in the left-right direction and on the lower side of the emitter electrode E0 in the longitudinal direction in FIG. 1A. Portions of a collector electrode C0 are disposed on both sides of the base electrode B0. The portions of the collector electrode C0 also each have a planar shape (for example, a rectangular shape) that is long in a direction parallel to the longitudinal direction of the emitter electrode E0. The collector electrode C0, the base electrode B0, and the emitter electrode E0 are disposed inside an active region 21.

A first-layer emitter wiring line E1 is disposed so as to substantially overlap the emitter electrode E0 in plan view. A first-layer collector wiring line C1 is disposed so as to substantially overlap the portions of the collector electrode C0. The first-layer collector wiring line C1 is extended to the outside of end portions of the collector electrode C0 in the longitudinal direction and includes a collector-connecting portion C1a that connects the extended portions to each other.

Pads T0 for heat dissipation are disposed outside the pair of portions of the collector electrode C0 with respect to the width direction (the lateral direction in FIG. 1A) of the emitter electrode E0. A heat-conductive film T1 for heat conduction is disposed so as to overlap each of the pads T0. The pads T0 for heat dissipation are disposed in the same layer as the collector electrode C0. The heat-conductive film T1 is disposed in the same layer as the first-layer collector wiring line C1.

A second-layer emitter wiring line E2 is disposed so as to partially overlap a region through which an emitter current substantially flows, the region being part of an emitter layer. In the emitter layer, the region through which an emitter current flows is referred to as an emitter region 36. An emitter bump EB is disposed so as to substantially overlap the second-layer emitter wiring line E2. The second-layer emitter wiring line E2 is electrically connected to the first-layer emitter wiring line E1 disposed thereunder through a via hole provided in an interlayer insulating film.

Herein, the configuration in which two regions "partially overlap" covers both a configuration in which part of one region overlaps part of the other region in plan view, and a configuration in which the whole of one region overlaps part of the other region in plan view. The emitter region 36 substantially coincides with the region where the emitter electrode E0 is disposed. In the example illustrated in FIG. 1A, the whole of the emitter region 36 overlaps part of each of the second-layer emitter wiring line E2 and the emitter bump EB.

The second-layer emitter wiring line E2 and the emitter bump EB pass through above the portions of the collector electrode C0 disposed on both sides of the emitter electrode E0 and extend to above the pads T0 for heat dissipation and the heat-conductive films T1. The second-layer emitter wiring line E2 is electrically connected to the heat-conductive films T1 through via holes provided in the interlayer insulating film.

The collector-connecting portion C1a of the first-layer collector wiring line C1 is disposed outside the second-layer emitter wiring line E2 and the emitter bump EB. A second-layer collector wiring line C2 is disposed so as to overlap the collector-connecting portion C1a. The second-layer collector wiring line C2 is electrically connected to the first-layer collector wiring line C1 through via holes provided in the interlayer insulating film. A collector bump CB is disposed so as to substantially overlap the second-layer collector wiring line C2. The collector bump CB is electrically connected to the second-layer collector wiring line C2.

Figure 1B:
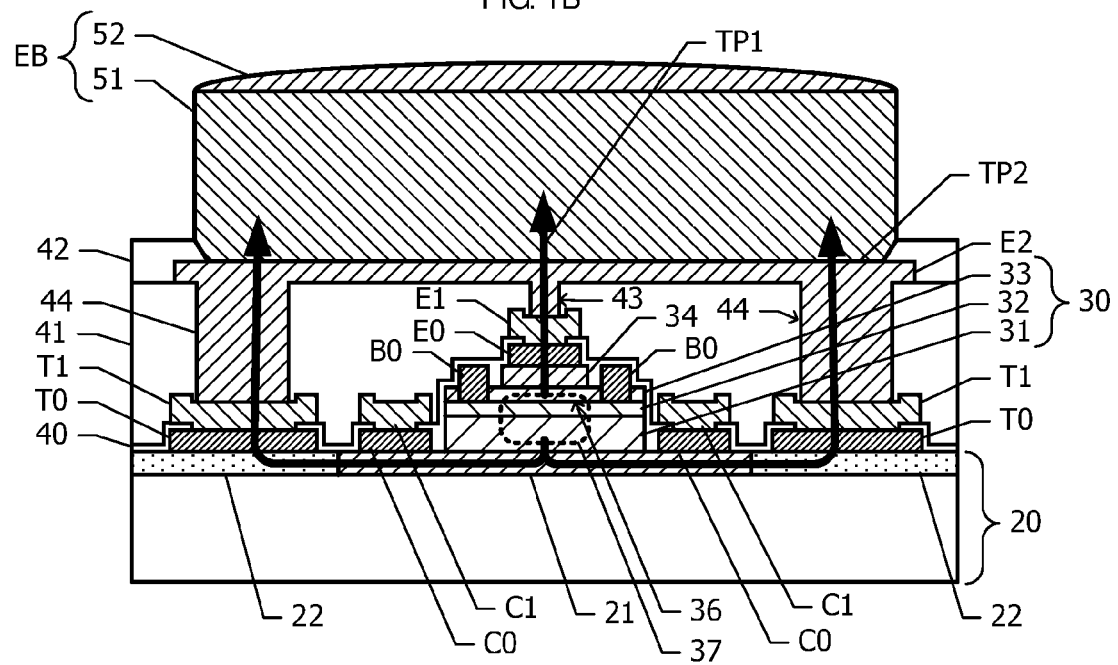
FIG. 1B is a sectional view taken along dash-dotted line 1B-1B in FIG. 1A.

FIG. 1B is a sectional view taken along dash-dotted line 1B-1B in FIG. 1A. This sectional view illustrates not only electrodes and wiring lines but also a substrate and semiconductor layers. The power amplifier module according to the first embodiment includes a heterojunction bipolar transistor (HBT).

An active region 21 having electrical conductivity and an insulating element isolation region 22 are defined in an upper surface of a substrate 20. The element isolation region 22 is adjacent to the active region 21 and surrounds the active region 21. The substrate 20 includes, for example, a base substrate made of a semi-insulating compound semiconductor and an epitaxial growth layer made of an n-type compound semiconductor that is grown on the base substrate. Part of the epitaxial growth layer is subjected to insulating implantation to thereby form the element isolation region 22. Herein, the term "insulating implantation" refers to ion implantation conducted in order to change a semiconductor to have an insulating property. The region that is not subjected to the insulating implantation corresponds to the active region 21.

A mesa structure 30 in which a collector layer 31, a base layer 32, and an emitter layer 33 are sequentially stacked is formed on a partial region of the active region 21 of the substrate 20. An emitter contact layer 34 is disposed on a partial region of the emitter layer 33. In the emitter layer 33, a region on which the emitter contact layer 34 is not disposed is depleted. An emitter current flows through, at a junction interface between the emitter layer 33 and the base layer 32, an emitter region 36 that overlaps the emitter contact layer 34 in plan view. As illustrated in FIG. 1A, the emitter region 36 substantially coincides with the emitter electrode E0 and the emitter contact layer 34 in plan view. During the operation of the HBT, the emitter region 36 and part of the base layer 32 and collector layer 31 located right under the emitter region 36 become a heat-generating source 37.

Portions of a collector electrode C0 are disposed on the active region 21 on both sides of the mesa structure 30. The collector electrode C0 is ohmically connected to the active region 21. A base electrode B0 is disposed on both sides of the emitter contact layer 34. The base electrode B0 is disposed in an opening formed in the emitter layer 33 and ohmically connected to the base layer 32. An emitter electrode E0 is disposed on the emitter contact layer 34.

Pads T0 for heat dissipation are disposed on the element isolation region 22 on both sides of the active region 21. The pads T0 for heat dissipation are in direct contact with the element isolation region 22 in the upper surface of the substrate 20 and thermally coupled to the element isolation region 22. The collector electrode C0, the base electrode B0, the emitter electrode E0, and the pads T0 for heat dissipation are each formed of a metal film or a metal multilayer film. An interlayer insulating film 40 covers the mesa structure 30, the emitter contact layer 34, the collector electrode C0, the base electrode B0, the emitter electrode E0, and the pads T0 for heat dissipation.

A first-layer emitter wiring line E1, a first-layer collector wiring line C1, and a heat-conductive film T1 are disposed on the emitter electrode E0, the collector electrode C0, and the pads T0 for heat dissipation, respectively. The first-layer emitter wiring line E1, the first-layer collector wiring line C1, and the heat-conductive film T1 are electrically connected to the emitter electrode E0, the collector electrode C0, and the pads T0 for heat dissipation, respectively, through openings formed in the interlayer insulating film 40. The heat-conductive film T1 is electrically connected to the pads T0 disposed thereunder without an insulating film therebetween, thereby reliably obtaining good heat transmission efficiency between the heat-conductive film T1 and the pads T0.

An interlayer insulating film 41 is disposed on the interlayer insulating film 40, the first-layer emitter wiring line E1, the first-layer collector wiring line C1, and the heat-conductive film T1. The interlayer insulating film 41 is formed of, for example, an insulating resin, and an upper surface of the interlayer insulating film 41 is substantially planarized.

A second-layer emitter wiring line E2 is disposed on the interlayer insulating film 41. The second-layer emitter wiring line E2 is electrically connected to the first-layer emitter wiring line E1 through a first via hole 43 formed in the interlayer insulating film 41. Furthermore, the second-layer emitter wiring line E2 is electrically connected to the heat-conductive film T1 through second via holes 44 formed in the interlayer insulating film 41. The second-layer emitter wiring line E2 is thermally coupled to the pads T0 with the heat-conductive film T1 therebetween.

A protective film 42 is disposed on the second-layer emitter wiring line E2 and the interlayer insulating film 41. An opening that substantially overlaps the second-layer emitter wiring line E2 in plan view is provided in the protective film 42. An emitter bump EB is disposed on the second-layer emitter wiring line E2 in the opening. The emitter bump EB includes, for example, a pillar 51 made of copper (Cu) and a solder 52 disposed on the upper surface of the pillar 51. The bump having this structure is referred to as a Cu pillar bump.

Next, advantageous effects of the power amplifier module according to the first embodiment will be described.

Heat generated in the heat-generating source 37 is transmitted to the emitter bump EB through a first thermal path TP1 formed by the emitter electrode E0, the first-layer emitter wiring line E1, a conductor in the first via hole 43, and the second-layer emitter wiring line E2. Since the emitter bump EB partially overlaps the emitter region (heat-generating source 37), the first thermal path TP1 connects the heat-generating source 37 to the emitter bump EB in the thickness direction in the shortest distance. This configuration enables heat-dissipation efficiency through the first thermal path TP1 to be enhanced. In addition, 90% or more of the emitter region preferably overlaps the emitter bump EB in plan view. With this configuration, the sectional area of the horizontal section of the first thermal path TP1 can be increased to enhance heat-dissipation efficiency through the first thermal path TP1. The term "horizontal section" refers to a section cut by an imaginary plane parallel to the upper surface of the substrate 20.

The thermal conductivities of the pads T0 for heat dissipation, the pads T0 being formed of a conductor, the heat-conductive film T1, and a conductor in the second via holes 44 are higher than the thermal conductivity of the interlayer insulating film 41. Therefore, heat generated in the heat-generating source 37 is transmitted to the emitter bump EB through a second thermal path TP2 formed by the substrate 20, the pads T0 for heat dissipation, the heat-conductive film T1, the conductor in the second via holes 44, and the second-layer emitter wiring line E2.

The area of the horizontal section of the first via hole 43 disposed in the first thermal path TP1 is restricted by the area of the emitter electrode E0. In contrast, the areas of the horizontal sections of the second via holes 44 are not subjected to such restriction because the second via holes 44 are disposed on the element isolation region 22. Similarly, the areas of the horizontal sections of the via holes provided in the interlayer insulating film 40 for the purpose of connecting the pads T0 to the heat-conductive film T1 are also not subjected to such restriction. Therefore, the section of the second thermal path TP2 can be made larger than the minimum section of the first thermal path TP1. The heat-dissipation efficiency through the second thermal path TP2 can be enhanced by increasing the area of the horizontal section of each of the second via holes 44 and the area of the horizontal section of each of the via holes provided in the interlayer insulating film 40 for the purpose of connecting the pads T0 to the heat-conductive film T1.

Furthermore, the second thermal path TP2 can be shortened because the emitter bump EB is arranged so as to partially overlap the pads T0 for heat dissipation in plan view. As a result, the heat-dissipation efficiency through the second thermal path TP2 can be further enhanced.

The horizontal section of the first thermal path TP1 corresponds to the horizontal section of a current path connecting the emitter bump EB to the emitter layer 33. In order to enhance the heat-dissipation efficiency, a minimum area of the horizontal section of a conductor portion that connects the emitter bump EB to a pad T0 for heat dissipation is preferably larger than a minimum area of the horizontal section of the current path that electrically connects the emitter bump EB to the emitter layer 33. In the first embodiment, for example, the minimum area of the horizontal section of the current path connecting the emitter bump EB to the emitter layer 33 is given at any of the positions of the via holes provided in the interlayer insulating films 40 and 41 disposed between the second-layer emitter wiring line E2 and the emitter layer 33. The minimum area of the horizontal section of the conductor portion connecting the emitter bump EB to the pad T0 is given at any of the position of the via hole provided in the interlayer insulating film 40 for connecting the pad T0 to the heat-conductive film T1 and the position of the second via hole 44 provided in the interlayer insulating film 41.

Furthermore, in the first embodiment, heat is dissipated from the heat-generating source 37 through the two types of thermal paths, that is, the first thermal path TP1 and the second thermal path TP2. Therefore, the heat-dissipation efficiency can be enhanced compared with the configuration in which only one of the thermal paths is used.

Second Embodiment

Next, a power amplifier module according to a second embodiment will be described with reference to FIGS. 2 and 3. Hereinafter, descriptions of configurations that are common to those of the power amplifier module according to the first embodiment will be omitted.

Figure 2:
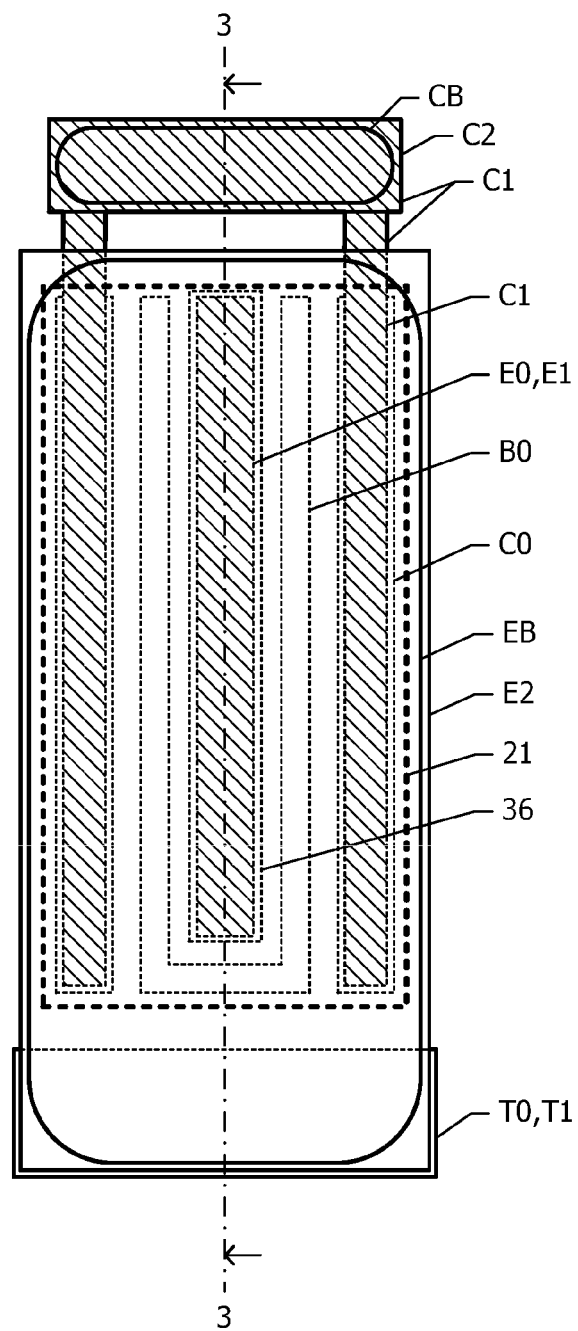
FIG. 2 is a plan view of an emitter electrode, a base electrode, and a collector electrode that are formed of metal and respectively connected to an emitter layer, a base layer, and a collector layer of a transistor of a power amplifier module according to a second embodiment and wiring lines that are formed of metal and disposed above the electrodes.

FIG. 2 is a plan view of an emitter electrode, a base electrode, and a collector electrode that are formed of metal and respectively connected to an emitter layer, a base layer, and a collector layer of a transistor included in a power amplifier module according to the second embodiment and wiring lines that are formed of metal and disposed above the electrodes. Components illustrated in FIG. 2 are assigned with the same reference signs as those assigned to the corresponding components of the power amplifier module according to the first embodiment illustrated in FIG. 1A.

In the first embodiment, the pads T0 for heat dissipation and the heat-conductive film T1 (FIG. 1A) are disposed in regions crossing an imaginary straight line formed by extending the emitter region in a direction orthogonal to the longitudinal direction of the emitter region. In the second embodiment, a pad T0 for heat dissipation and a heat-conductive film T1 are disposed in a region crossing an imaginary straight line formed by extending an emitter region 36 in the longitudinal direction of the emitter region 36.

Figure 3:
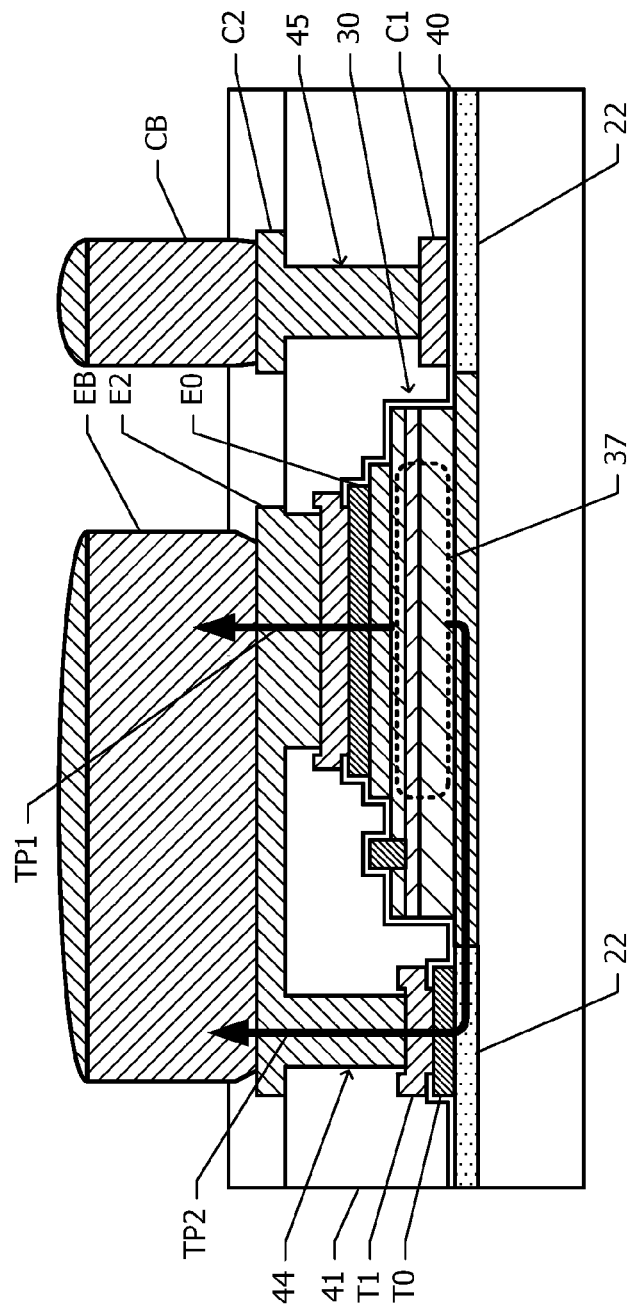
FIG. 3 is a sectional view taken along dash-dotted line 3-3 in FIG. 2.

FIG. 3 is a sectional view taken along dash-dotted line 3-3 in FIG. 2. A pad T0 for heat dissipation and a heat-conductive film T1 are disposed on an element isolation region 22 on the left side of an emitter electrode E0. A second-layer emitter wiring line E2 disposed on an interlayer insulating film 41 is electrically connected to the heat-conductive film T1 through a second via hole 44 provided in the interlayer insulating film 41.

A first-layer collector wiring line C1 is disposed on the element isolation region 22 with an interlayer insulating film 40 therebetween, the element isolation region 22 being located, with respect to the emitter electrode E0, on the opposite side of the region where the pad T0 for heat dissipation and the heat-conductive film T1 are disposed. A second-layer collector wiring line C2 is disposed on the interlayer insulating film 41. The second-layer collector wiring line C2 is electrically connected to the first-layer collector wiring line C1 through a third via hole 45 provided in the interlayer insulating film 41.

A collector bump CB is disposed on the second-layer collector wiring line C2. The collector bump CB has the same layered structure as an emitter bump EB.

Next, advantageous effects of the power amplifier module according to the second embodiment will be described. In the second embodiment, a first thermal path TP1 and a second thermal path TP2 that are similar to those in the first embodiment are formed. Therefore, heat-dissipation efficiency from a heat-generating source 37 can be enhanced as in the first embodiment.

Furthermore, in the second embodiment, with respect to the width direction of the emitter electrode E0, the dimension of a region where a mesa structure 30, the pad T0 for heat dissipation, and the heat-conductive film T1 are disposed is smaller than the dimension of the corresponding region of the power amplifier module according to the first embodiment. This configuration is advantageous when a plurality of HBTs are arranged in the width direction of the emitter electrode E0, as in an embodiment which will be described later with reference to FIG. 13.

Third Embodiment

Next, a power amplifier module according to a third embodiment will be described with reference to FIGS. 4 to 6. Hereinafter, descriptions of configurations that are common to those of the power amplifier module (FIGS. 2 and 3) according to the second embodiment will be omitted.

Figure 4:
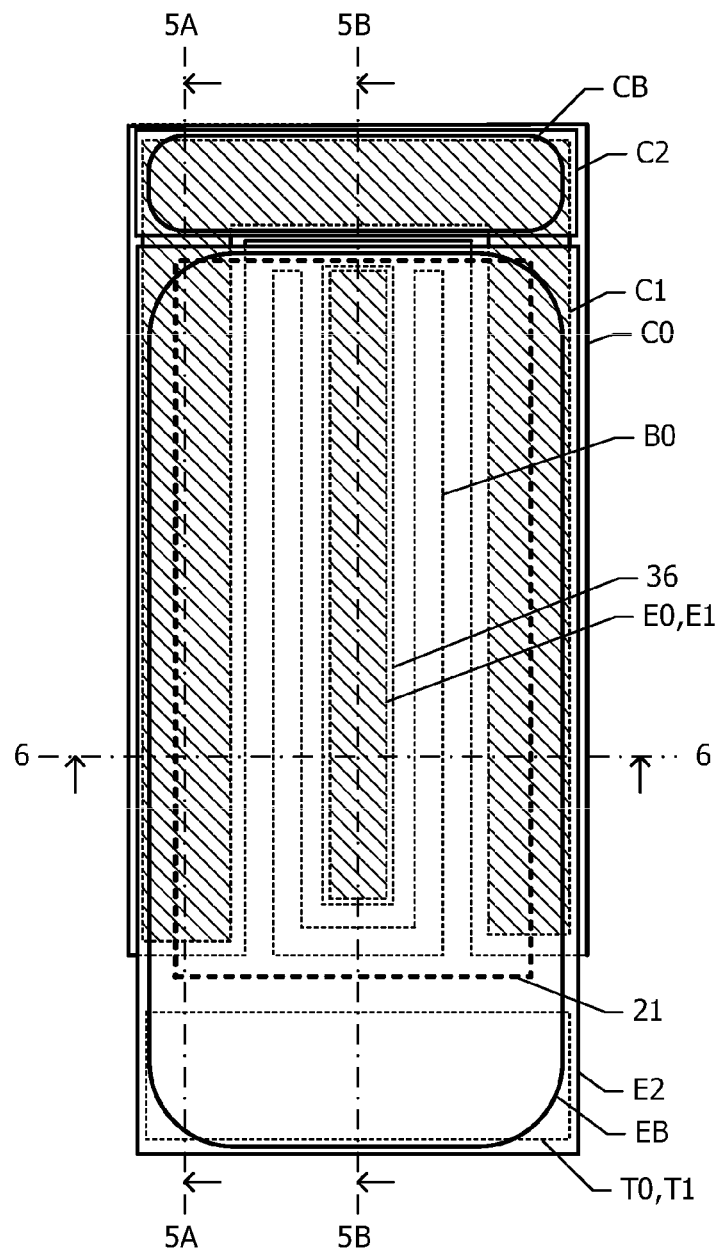
FIG. 4 is a plan view of an emitter electrode, a base electrode, and a collector electrode that are formed of metal and respectively connected to an emitter layer, a base layer, and a collector layer of a transistor of a power amplifier module according to a third embodiment and wiring lines that are formed of metal and disposed above the electrodes.

FIG. 4 is a plan view of an emitter electrode, a base electrode, and a collector electrode that are formed of metal and respectively connected to an emitter layer, a base layer, and a collector layer of a transistor included in a power amplifier module according to the third embodiment and wiring lines that are formed of metal and disposed above the electrodes. Components illustrated in FIG. 4 are assigned with the same reference signs as those assigned to the corresponding components of the power amplifier module according to the second embodiment illustrated in FIG. 2. In the second embodiment, the collector electrode C0 is disposed inside the active region 21 in plan view. In the third embodiment, a collector electrode C0 extends to the outside of an active region 21.

Portions of the collector electrode C0 disposed on both sides of an emitter electrode E0 spread to the outside of the active region 21 in the width direction of the emitter electrode E0. Furthermore, the collector electrode C0 extends to the outside of the active region 21 toward one end of the emitter electrode E0 in the longitudinal direction. The direction in which the collector electrode C0 extends is opposite to the direction toward the pad T0 for heat dissipation and the heat-conductive film T1 with respect to the active region 21. The portions of the collector electrode C0 disposed on both sides of the emitter electrode E0 are continuous with each other outside the active region 21. A first-layer collector wiring line C1 has a planar shape that substantially overlaps the collector electrode C0.

Figure 5A:
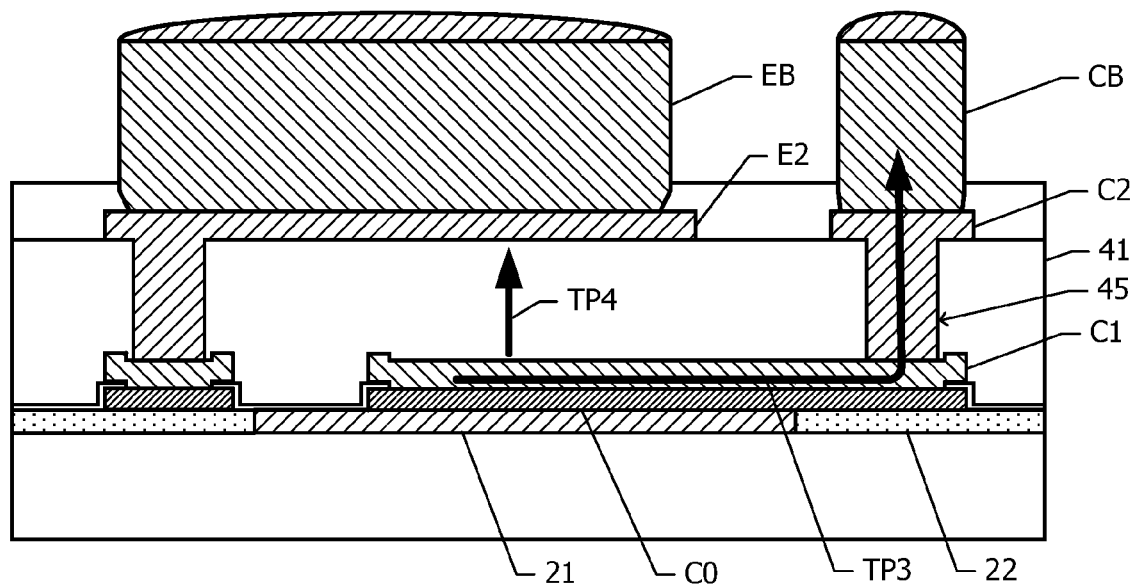
FIG. 5A is a sectional view taken along dash-dotted line 5A-5A in FIG. 4.

FIG. 5A is a sectional view taken along dash-dotted line 5A-5A in FIG. 4. A collector electrode C0 extends from an active region 21 toward the right side to the outside of the active region 21 and reaches an element isolation region 22. A first-layer collector wiring line C1 disposed on the collector electrode C0 also extends to the element isolation region 22. The collector electrode C0 is in direct contact with the surfaces of the active region 21 and the element isolation region 22.

A second-layer collector wiring line C2 disposed on an interlayer insulating film 41 is electrically connected to the first-layer collector wiring line C1 through a third via hole 45 provided in the interlayer insulating film 41. A collector bump CB is disposed on the second-layer collector wiring line C2. The collector bump CB partially overlaps the collector electrode C0 in plan view.

Figure 5B:
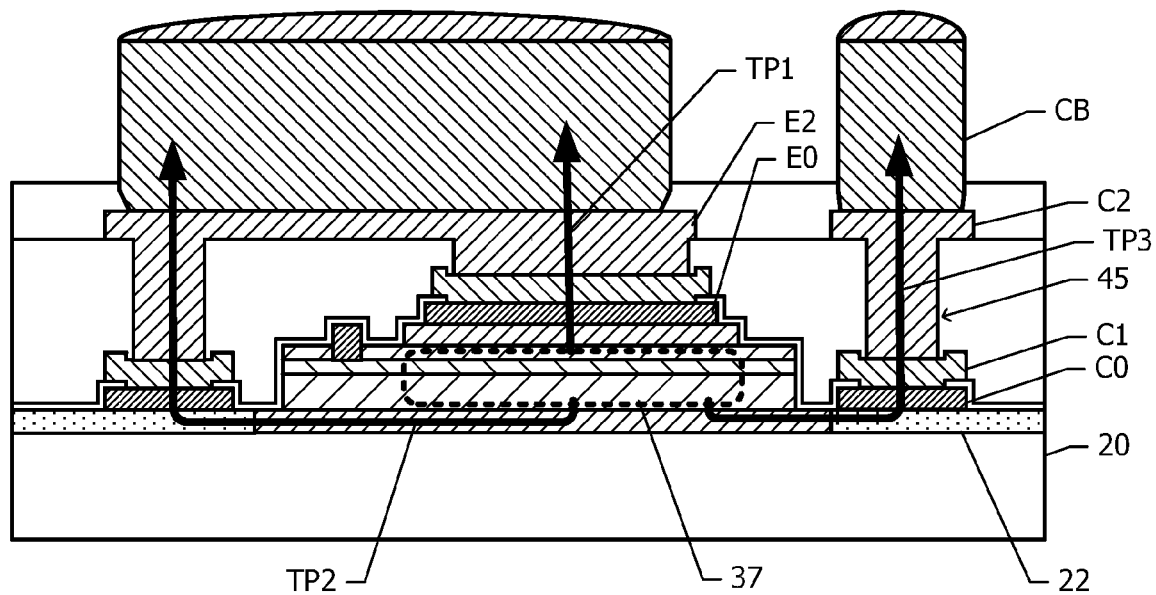
FIG. 5B is a sectional view taken along dash-dotted line 5B-5B in FIG. 4.

FIG. 5B is a sectional view taken along dash-dotted line 5B-5B in FIG. 4. The sectional view of FIG. 5B corresponds to the sectional view of the power amplifier module according to the second embodiment illustrated in FIG. 3. In the second embodiment, the interlayer insulating film 40 is disposed between the first-layer collector wiring line C1 and the element isolation region 22. In the third embodiment, the first-layer collector wiring line C1 is in direct contact with the collector electrode C0, and the collector electrode C0 is in direct contact with the element isolation region 22. In the section illustrated in FIG. 5B, the collector bump CB partially overlaps the collector electrode C0 in plan view.

Figure 6:
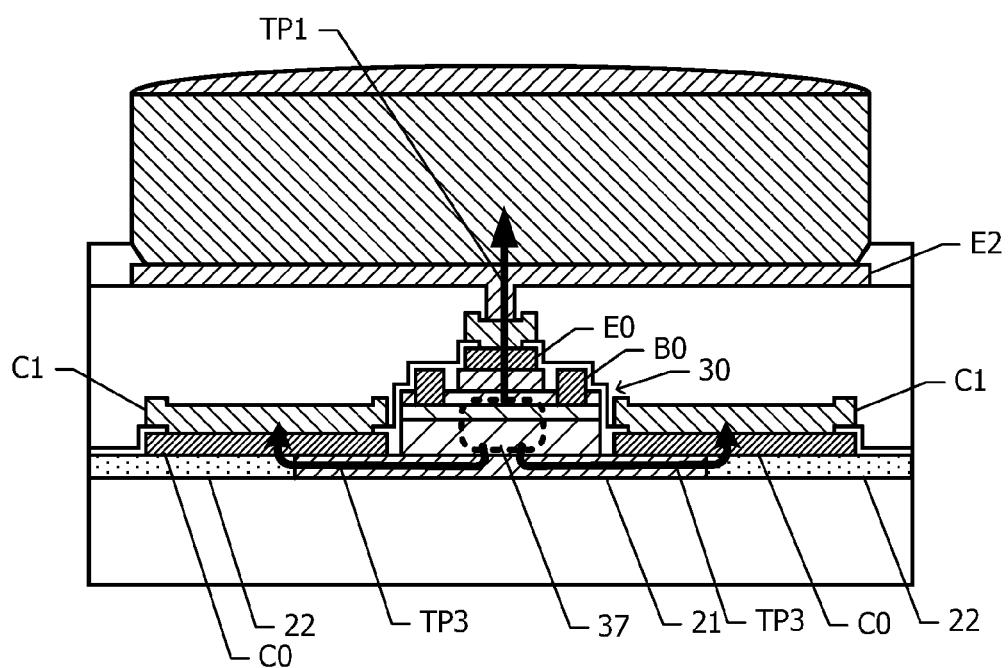
FIG. 6 is a sectional view taken along dash-dotted line 6-6 in FIG. 4.

FIG. 6 is a sectional view taken along dash-dotted line 6-6 in FIG. 4. A collector electrode C0 disposed on both sides of a mesa structure 30 spreads in the width direction (the right direction and the left direction in FIG. 6) of an emitter electrode E0 and reaches on an element isolation region 22. A first-layer collector wiring line C1 is disposed on the collector electrode C0.

Next, advantageous effects of the power amplifier module according to the third embodiment will be described. In the third embodiment, efficient heat dissipation can be performed from a heat-generating source 37 through a first thermal path TP1 (FIGS. 5B and 6) and a second thermal path TP2 (FIG. 5B) as in the second embodiment.

Furthermore, in the third embodiment, the substrate 20, the collector electrode C0, the first-layer collector wiring line C1, a conductor in the third via hole 45, and the second-layer collector wiring line C2 form a third thermal path TP3 (FIGS. 5A, 5B, and 6). Therefore, heat-dissipation efficiency can be further enhanced.

Heat generated in the heat-generating source 37 is transmitted through the substrate 20 in the lateral direction and reaches the nearest collector electrode C0, as illustrated in FIG. 6. Subsequently, as illustrated in FIG. 5A, the heat is transmitted through the collector electrode C0 and the first-layer collector wiring line C1 in the in-plane direction and reaches the third via hole 45. In the third thermal path TP3, since a portion that is long in the longitudinal direction of the emitter electrode E0 includes the collector electrode C0 and the first-layer collector wiring line C1 that are formed of a metal, efficient heat transmission can be performed.

Furthermore, in the third embodiment, since the collector electrode C0 extends to the element isolation region 22 adjacent to the active region 21, the area of the horizontal section of the third thermal path TP3 can be increased. As a result, heat-dissipation efficiency can be further enhanced.

Furthermore, in the third embodiment, the second-layer emitter wiring line E2 and the emitter bump EB (FIGS. 5A and 6) partially overlap the collector electrode C0 (FIGS. 5A and 6), which is in contact with the upper surface of the substrate 20, in plan view. In the overlapping portion, a fourth thermal path TP4 (FIG. 5A) is formed from the collector electrode C0 through the first-layer collector wiring line C1 and the interlayer insulating film 41 toward the second-layer emitter wiring line E2. Although the thermal conductivity of the interlayer insulating film 41 is lower than that of metal, this fourth thermal path TP4 also sufficiently functions as a heat-dissipation path of heat generated in the heat-generating source 37 (FIG. 6) when the portion where the second-layer emitter wiring line E2 overlaps the collector electrode C0 has a large area. Therefore, heat-dissipation efficiency can be enhanced.

Modification of Third Embodiment

Next, a power amplifier module according to a modification of the third embodiment will be described with reference to FIGS. 7A and 7B.

Figure 7A:
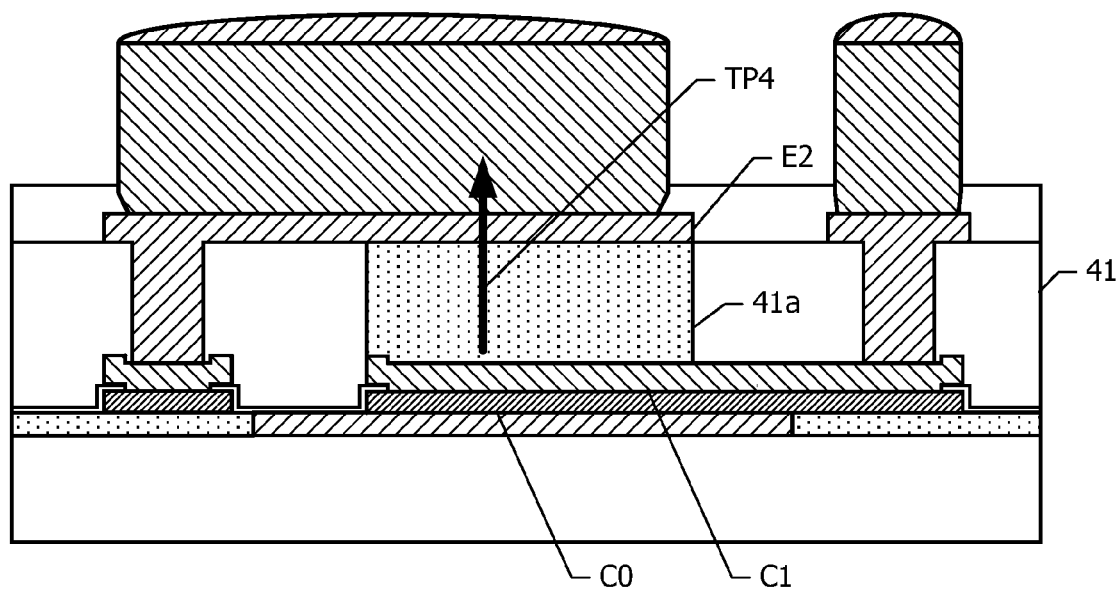
FIGS. 7A and 7B are sectional views each illustrating a power amplifier module according to a modification of the third embodiment.
Figure 7B:
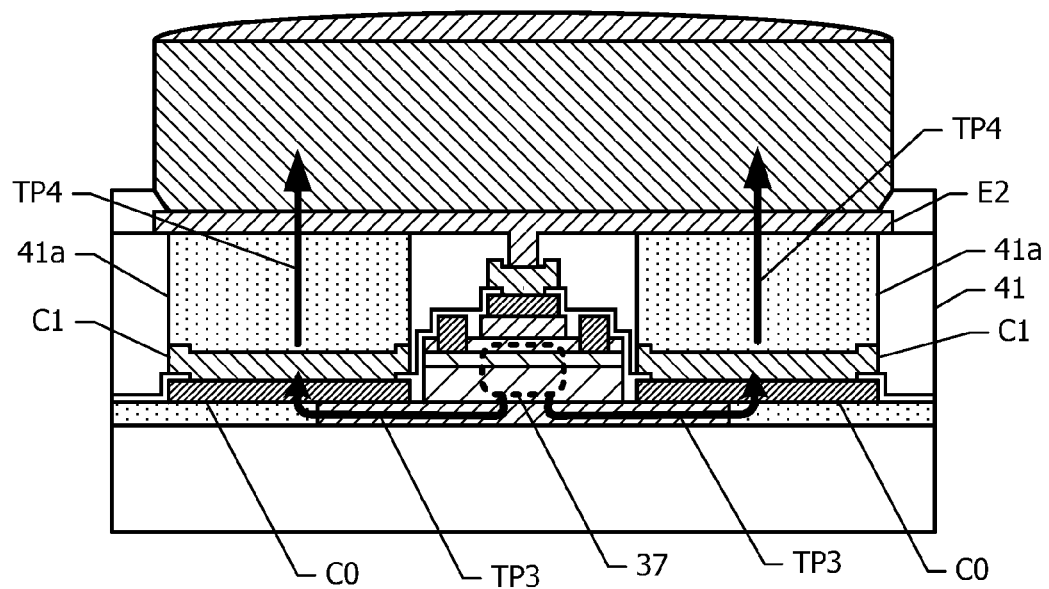

FIGS. 7A and 7B are sectional views of a power amplifier module according to a modification of the third embodiment and correspond to the sectional views of FIG. 5A and FIG. 6 of the power amplifier module according to the third embodiment, respectively. In this modification, in an interlayer insulating film 41, a region 41a where a second-layer emitter wiring line E2 overlaps a collector electrode C0 in plan view has a higher thermal conductivity than other regions of the interlayer insulating film 41. The thermal conductivity of this overlapping region 41a can be enhanced by mixing particles having a high thermal conductivity in the overlapping region 41a of the interlayer insulating film 41. Such an interlayer insulating film 41 can be formed by, for example, forming a resin film made of a polyimide or the like over the entire region, subsequently removing the resin film in the overlapping region 41a, and embedding, in the region from which the resin film has been removed, an insulating material that contains a plurality of particles having a higher thermal conductivity than the resin film.

In this modification, the thermal resistance of the fourth thermal path TP4 from the collector electrode C0 through the first-layer collector wiring line C1 and the interlayer insulating film 41 toward the second-layer emitter wiring line E2 can be reduced. As a result, heat transmitted through the third thermal path TP3 to the collector electrode C0 can be efficiently dissipated through the fourth thermal path TP4.

In the above modification of the third embodiment, the material having a high thermal conductivity is used in only part of the interlayer insulating film 41. Alternatively, the material having a high thermal conductivity may be used in the whole of the interlayer insulating film 41. For example, the whole of the interlayer insulating film 41 may be formed by using an insulating material that contains a plurality of particles made of an inorganic material having a higher thermal conductivity than resins.

Fourth Embodiment

Next, a power amplifier module according to a fourth embodiment will be described with reference to FIGS. 8 to 10. Hereinafter, descriptions of configurations that are common to those of the power amplifier module according to the third embodiment will be omitted.

Figure 8:
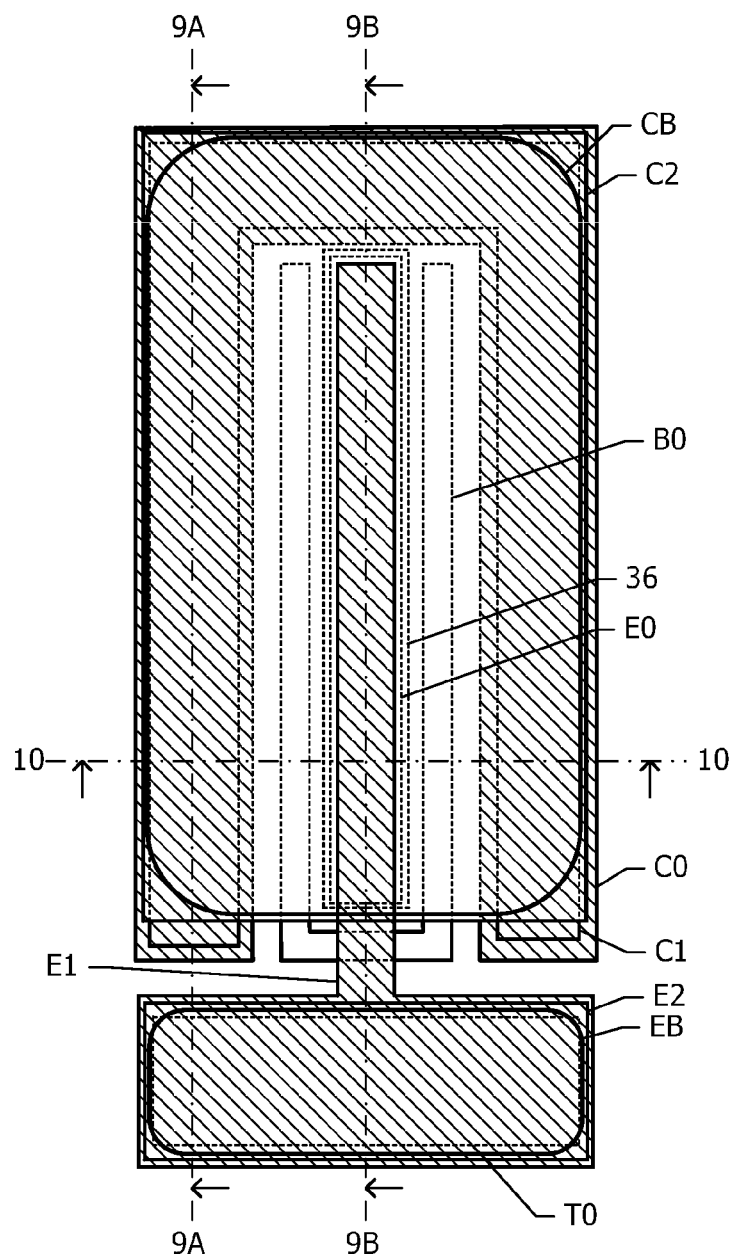
FIG. 8 is a plan view of an emitter electrode, a base electrode, and a collector electrode that are formed of metal and respectively connected to an emitter layer, a base layer, and a collector layer of a transistor of a power amplifier module according to a fourth embodiment and wiring lines that are formed of metal and disposed above the electrodes.

FIG. 8 is a plan view of an emitter electrode, a base electrode, and a collector electrode that are formed of metal and respectively connected to an emitter layer, a base layer, and a collector layer of a transistor included in a power amplifier module according to the fourth embodiment and wiring lines that are formed of metal and disposed above the electrodes. Components illustrated in FIG. 8 are assigned with the same reference signs as those assigned to the corresponding components of the power amplifier module according to the third embodiment illustrated in FIG. 4.

In the third embodiment, the second-layer emitter wiring line E2 and the emitter bump EB (FIG. 4) partially overlap the emitter region 36. In contrast, in the fourth embodiment, a second-layer collector wiring line C2 and a collector bump CB partially overlap an emitter region 36. A second-layer emitter wiring line E2 and an emitter bump EB do not overlap the emitter region 36. The second-layer collector wiring line C2 and the collector bump CB also partially overlap a collector electrode C0 disposed on both sides of an emitter electrode E0.

A first-layer emitter wiring line E1 disposed to overlap the emitter electrode E0 is led to the outside of the second-layer collector wiring line C2 (the lower side in the longitudinal direction in FIG. 8) in plan view. The first-layer emitter wiring line E1 has an increased width on the outside of the second-layer collector wiring line C2 so as to have an increased area. The second-layer emitter wiring line E2 and the emitter bump EB are disposed in the region having the increased width so as to overlap with each other. Furthermore, a pad T0 for heat dissipation is also disposed so as to overlap the region having the increased width.

Figure 9A:
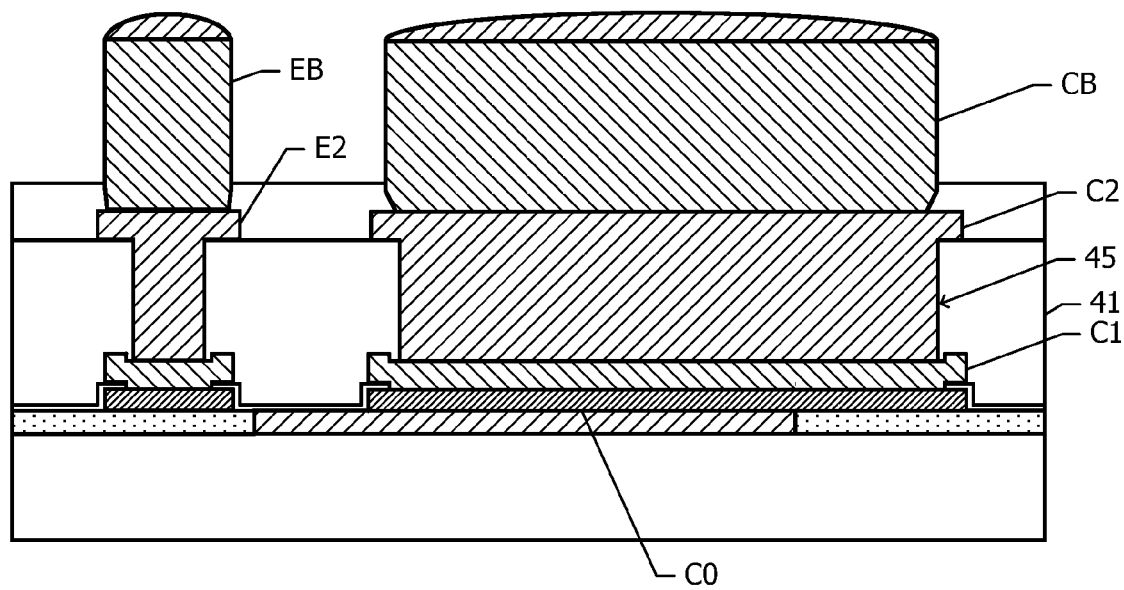
FIG. 9A is a sectional view taken along dash-dotted line 9A-9A in FIG. 8.

FIG. 9A is a sectional view taken along dash-dotted line 9A-9A in FIG. 8 and corresponds to a sectional view of the power amplifier module according to the third embodiment illustrated in FIG. 5A. In the third embodiment, the second-layer emitter wiring line E2 (FIG. 5A) and the emitter bump EB (FIG. 5A) extend to above the collector electrode C0 (FIG. 5A). In the fourth embodiment, a second-layer emitter wiring line E2 and an emitter bump EB do not overlap a collector electrode C0. A second-layer collector wiring line C2 and a collector bump CB are disposed right on the collector electrode C0 and a first-layer collector wiring line C1. The second-layer collector wiring line C2 is electrically connected to the first-layer collector wiring line C1 through a third via hole 45 provided in an interlayer insulating film 41.

Figure 9B:
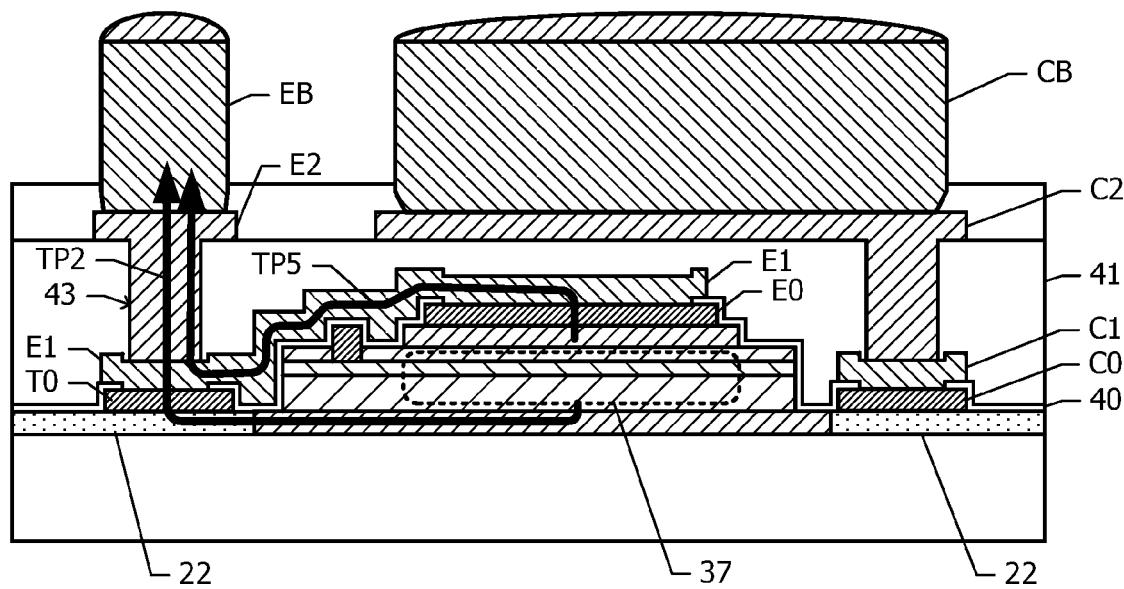
FIG. 9B is a sectional view taken along dash-dotted line 9B-9B in FIG. 8.

FIG. 9B is a sectional view taken along dash-dotted line 9B-9B in FIG. 8 and corresponds to a sectional view of the power amplifier module according to the third embodiment illustrated in FIG. 5B. In the third embodiment, the second-layer emitter wiring line E2 (FIG. 5B) is disposed right on the emitter electrode E0 (FIG. 5B). In the fourth embodiment, a first-layer emitter wiring line E1 disposed on an emitter electrode E0 extends toward the left side of FIG. 9B and reaches a pad T0 for heat dissipation, the pad T0 being disposed on an element isolation region 22.

The second-layer emitter wiring line E2 and the emitter bump EB are disposed on the interlayer insulating film 41 so as to overlap the pad T0 for heat dissipation in plan view. The second-layer emitter wiring line E2 is electrically connected to the first-layer emitter wiring line E1 through a first via hole 43 provided in the interlayer insulating film 41. A second thermal path TP2 from a heat-generating source 37 to the emitter bump EB is formed as in the second thermal path TP2 (FIG. 3) of the power amplifier module according to the second embodiment. A fifth thermal path TP5 is further formed from the heat-generating source 37 to the emitter bump EB through the emitter electrode E0, the first-layer emitter wiring line E1, a conductor in the first via hole 43, and the second-layer emitter wiring line E2. The second-layer collector wiring line C2 and the collector bump CB that are disposed so as to partially overlap the collector electrode C0 disposed on the element isolation region 22 extend to a region above the emitter electrode E0.

Figure 10:
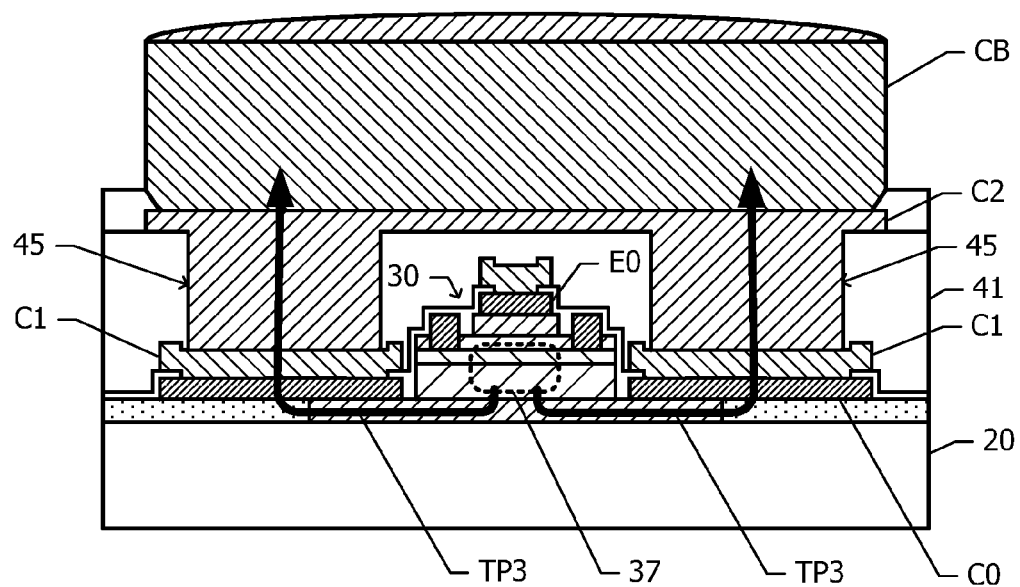
FIG. 10 is a sectional view taken along dash-dotted line 10-10 in FIG. 8.

FIG. 10 is a sectional view taken along dash-dotted line 10-10 in FIG. 8 and corresponds to the sectional view of the power amplifier module according to the third embodiment illustrated in FIG. 6. In the third embodiment, the second-layer emitter wiring line E2 (FIG. 6) is disposed right on the emitter electrode E0 (FIG. 6). In the fourth embodiment, the second-layer collector wiring line C2 and the collector bump CB are disposed right above the emitter electrode E0 with the interlayer insulating film 41 therebetween. The second-layer collector wiring line C2 is electrically connected to the first-layer collector wiring line C1 disposed on both sides of a mesa structure 30 through the third via hole 45 provided in the interlayer insulating film 41.

Next, advantageous effects of the power amplifier module according to the fourth embodiment will be described.

In the fourth embodiment, a third thermal path TP3 (FIG. 10) is formed from the heat-generating source 37 to the collector bump CB through a substrate 20, the collector electrode C0, the first-layer collector wiring line C1, a conductor in the third via hole 45, and the second-layer collector wiring line C2. In the third embodiment, heat generated in the heat-generating source 37 is transmitted through the substrate 20 and reaches the collector electrode C0 (FIG. 6), is then transmitted through the collector electrode C0 (FIG. 5A) and the first-layer collector wiring line C1 (FIG. 5A) in the in-plane direction, and reaches the collector bump CB. In the fourth embodiment, the collector electrode C0 disposed on both sides of the heat-generating source 37 is connected to the collector bump CB disposed right above the collector electrode C0 with the conductor in the third via hole 45 therebetween. Therefore, the third thermal path TP3 is shorter than that in the configuration of the third embodiment. As a result, heat-dissipation efficiency from the heat-generating source 37 through the collector bump CB can be enhanced.

Furthermore, in the fourth embodiment, the second thermal path TP2 including the pad T0 for heat dissipation (FIG. 9B) is also used as a heat-dissipation path as in the power amplifier module (FIG. 1B) according to the first embodiment. Therefore, heat-dissipation efficiency can be enhanced as in the case of the first embodiment.

Modification of Fourth Embodiment

Next, a modification of the fourth embodiment will be described with reference to FIGS. 11A and 11B.

Figure 11A:
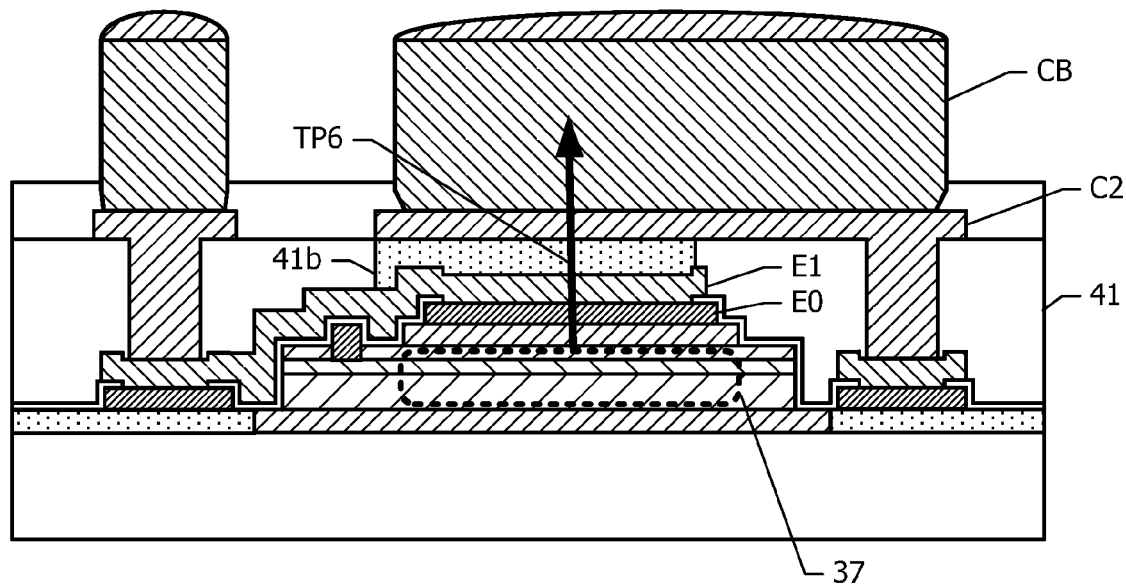
FIGS. 11A and 11B are sectional views each illustrating a power amplifier module according to a modification of the fourth embodiment.
Figure 11B:
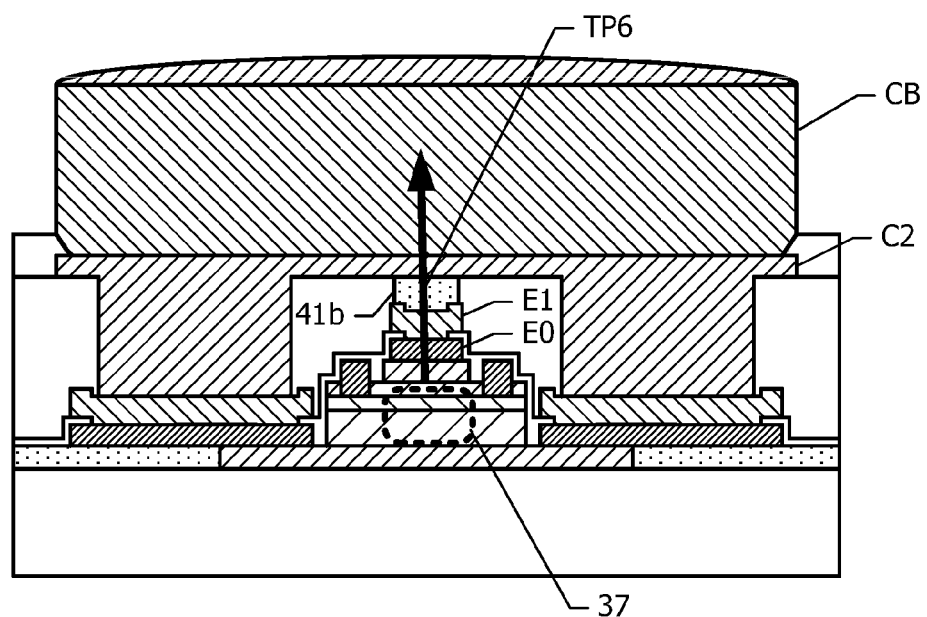

FIGS. 11A and 11B are sectional views of a power amplifier module according to a modification of the fourth embodiment and correspond to the sectional views of FIG. 9B and FIG. 10 of the power amplifier module according to the fourth embodiment, respectively. In this modification, in an interlayer insulating film 41, a region 41b where a first-layer emitter wiring line E1 overlaps a second-layer collector wiring line C2 in plan view has a higher thermal conductivity than other regions of the interlayer insulating film 41.

In this modification, a sixth thermal path TP6 is formed from a heat-generating source 37 to a collector bump CB through the emitter electrode E0, the first-layer emitter wiring line E1, the region 41b of the interlayer insulating film 41, and the second-layer collector wiring line C2. With this configuration, heat-dissipation efficiency can be enhanced compared with the fourth embodiment.

Fifth Embodiment

Next, a power amplifier module according to a fifth embodiment will be described with reference to FIG. 12.

Figure 12:
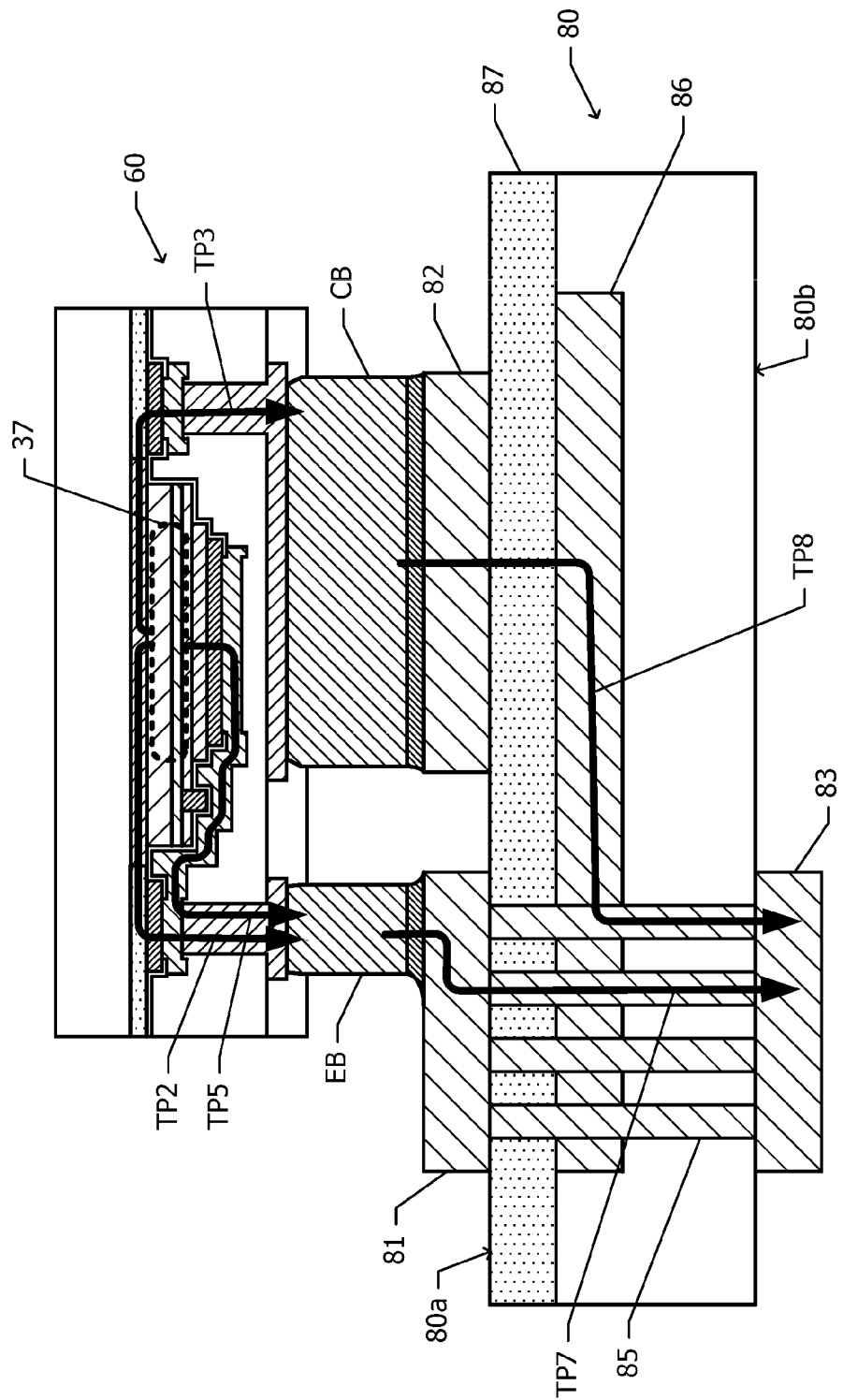
FIG. 12 is a sectional view of a power amplifier module according to a fifth embodiment.

FIG. 12 is a sectional view of a power amplifier module according to the fifth embodiment. The power amplifier module according to the fifth embodiment includes a module substrate 80 and a semiconductor chip 60 mounted on the module substrate 80. The semiconductor chip 60 has the same configuration as the power amplifier module according to the fourth embodiment or the modification of the fourth embodiment.

The module substrate 80 has a first land 81 and a second land 82 on one surface (first surface) 80a thereof and a third land 83 on the other surface (second surface) 80b thereof. The first land 81 is electrically connected to the third land 83 with a plurality of via conductors 85 therebetween, the via conductors 85 extending from the first surface 80a to the second surface 80b. The module substrate 80 further includes an inner-layer conductor 86 as an inner layer. The inner-layer conductor 86 is electrically connected to the first land 81 and the third land 83 with the via conductors 85 therebetween. The inner-layer conductor 86 functions as, for example, a ground plane. The inner-layer conductor 86 and the second land 82 partially overlap in plan view. An insulating film 87 disposed between the inner-layer conductor 86 and the second land 82 has a higher thermal conductivity than other insulating portions of the module substrate 80.

An emitter bump EB and a collector bump CB of the semiconductor chip 60 are bonded to the first land 81 and the second land 82, respectively. The third land 83 is bonded to, for example, a land for a ground of a printed circuit board such as a motherboard. The land for a ground is connected to a ground plane having a large area in the printed circuit board. This ground plane functions as a heatsink.

Next, advantageous effects of the power amplifier module according to the fifth embodiment will be described.

Heat generated in a heat-generating source 37 of the semiconductor chip 60 is transmitted through the second thermal path TP2 (FIG. 9B) and the fifth thermal path TP5 (FIG. 9B) to the emitter bump EB. The heat transmitted to the emitter bump EB is further dissipated to the outside of the power amplifier module through a seventh thermal path TP7 including the first land 81, the via conductors 85, and the third land 83.

Furthermore, the heat generated in the heat-generating source 37 is transmitted through a third thermal path TP3 (FIG. 12) to the collector bump CB. The heat transmitted to the collector bump CB is dissipated to the outside of the power amplifier module through an eighth thermal path TP8 including the second land 82, the insulating film 87, the inner-layer conductor 86, the via conductors 85, and the third land 83.

Since the second land 82 and the inner-layer conductor 86 partially overlap, the thermal resistance of the eighth thermal path TP8 can be reduced. In addition, the thermal resistance of the eighth thermal path TP8 can be further reduced by making the thermal conductivity of the insulating film 87 disposed between the second land 82 and the inner-layer conductor 86 higher than the thermal conductivity of other insulating portions of the module substrate 80. This configuration enables heat-dissipation efficiency from the heat-generating source 37 of the semiconductor chip 60 to the outside of the power amplifier module to be enhanced. In the fifth embodiment, the entire region of the insulating film 87 has a higher thermal conductivity than other insulating portions. Alternatively, in the insulating film 87, at least part of a region where the inner-layer conductor 86 and the second land 82 overlap may have a higher thermal conductivity than other insulating portions.

In the fifth embodiment, a power amplifier module having the same configuration as the power amplifier module according to the fourth embodiment or the modification of the fourth embodiment is used as the semiconductor chip 60. Alternatively, the semiconductor chip 60 may be a power amplifier module having the same configuration as the power amplifier module according to any of the first to third embodiments or modifications thereof.

Sixth Embodiment

Next, a power amplifier module according to a sixth embodiment will be described with reference to FIGS. 13 and 14. The power amplifier module according to the sixth embodiment includes transistors Q each having the same configuration as the transistor (FIGS. 2 and 3) of the power amplifier module according to the second embodiment. Hereinafter, detailed descriptions of configurations of the transistors Q will be omitted.

Figure 13:
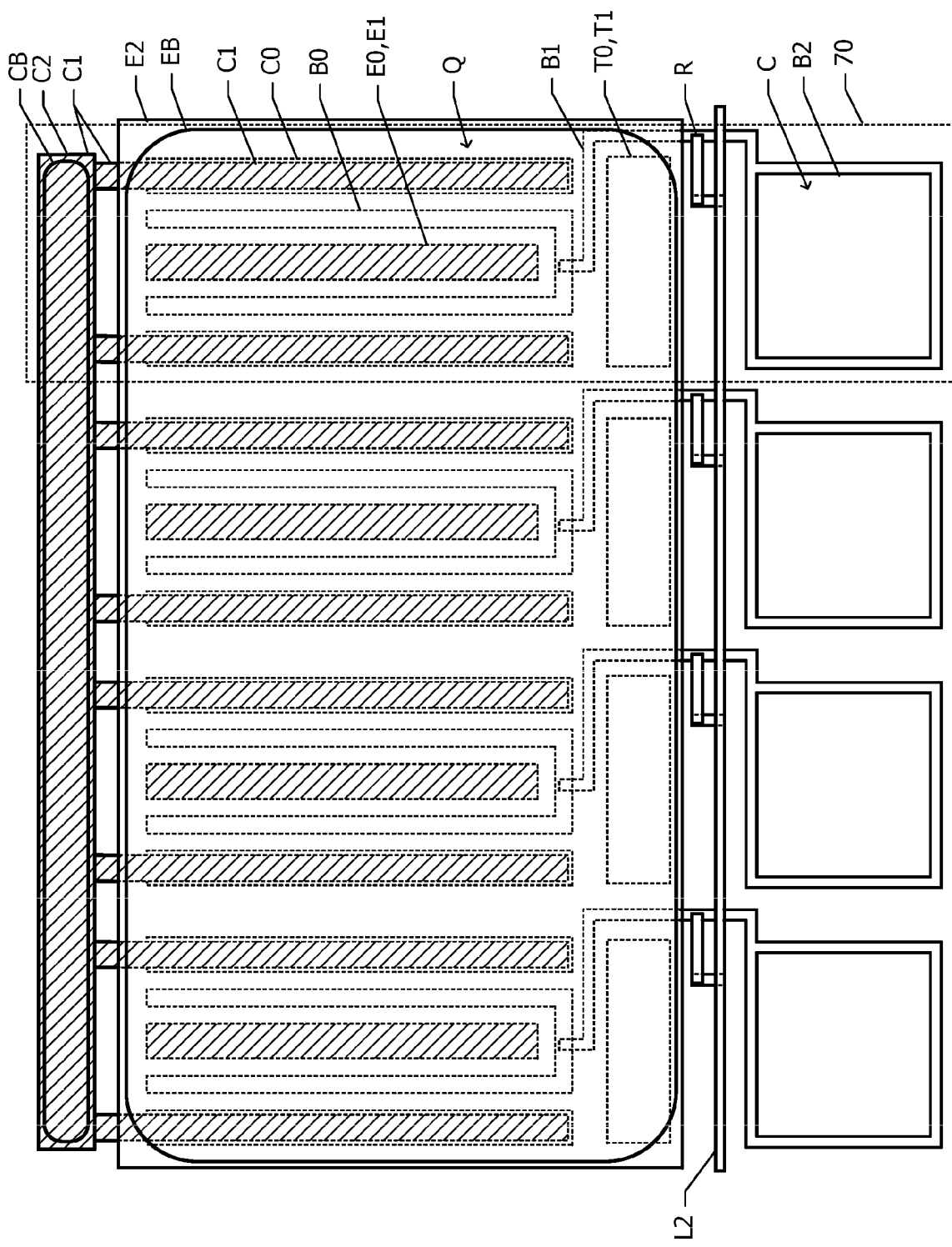
FIG. 13 is a plan view of a main part of an output-stage amplifier of a power amplifier module according to a sixth embodiment.

FIG. 13 is a plan view of a main part of an output-stage amplifier of the power amplifier module according to the sixth embodiment. In FIG. 13, components of a transistor Q are assigned with the same reference signs as those assigned to the corresponding components of the power amplifier module (FIGS. 2 and 3) according to the second embodiment. A plurality of HBT units 70 are arranged side by side. Each of the HBT units 70 includes a transistor Q (FIG. 2), a ballast resistor R, and a DC cut capacitor C. The direction in which the plurality of HBT units 70 are arranged is orthogonal to the longitudinal direction of an emitter electrode E0 of the transistor Q.

A second-layer emitter wiring line E2 and an emitter bump EB spread in the direction in which the HBT units 70 are arranged and are used in common by the plurality of transistors Q. Thus, the emitter bump EB overlaps the emitter electrodes E0 of the HBT units 70. The emitter bump EB further overlaps a plurality of pads T0 for heat dissipation and heat-conductive films T1 that are arranged for the respective HBT units 70.

A first-layer collector wiring line C1 has a comb-tooth-like planar shape. Comb-tooth portions of the first-layer collector wiring line C1 are disposed on both sides of each of the emitter electrodes E0. A collector-connecting portion C1a disposed outside the second-layer emitter wiring line E2 extends in the direction in which the HBT units 70 are arranged to connect the plurality of comb-tooth portions of the HBT units 70 together. A second-layer collector wiring line C2 is disposed so as to overlap the collector-connecting portion C1a.

The ballast resistor R and the DC cut capacitor C are arranged to correspond to each of the plurality of transistors Q. A first-layer base wiring line B1 is connected to a base electrode B0. The first-layer base wiring line B1 is led to a region where the emitter bump EB is not disposed, and connected to a second-layer bias wiring line L2 with the ballast resistor R therebetween. Furthermore, the first-layer base wiring line B1 functions as a lower electrode of the DC cut capacitor C. A second-layer base wiring line B2 disposed so as to partially overlap the first-layer base wiring line B1 functions as an upper electrode of the DC cut capacitor C. For example, the entire region of the second-layer base wiring line B2 is disposed inside the first-layer base wiring line B1 in plan view.

Figure 14:
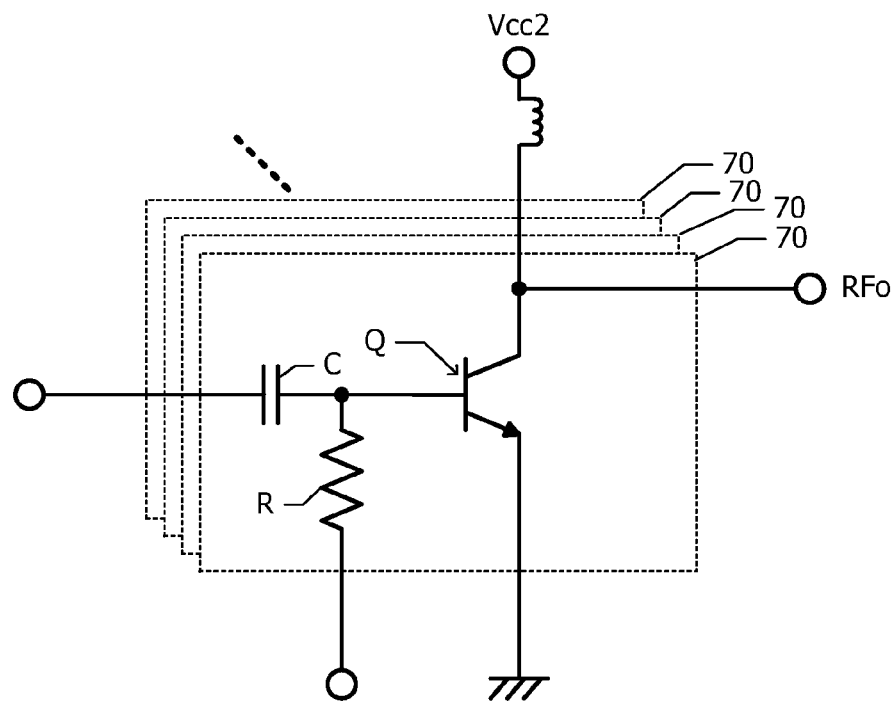
FIG. 14 is an equivalent circuit diagram of an output stage of a power amplifier according to the sixth embodiment.

FIG. 14 is an equivalent circuit diagram of an output stage of a power amplifier according to the sixth embodiment. A plurality of HBT units 70 are connected in parallel. Each of the HBT units 70 includes a transistor Q, a ballast resistor R, and a DC cut capacitor C. The transistors Q of the HBT units 70 are connected in parallel. A power supply voltage Vcc is applied to a collector of a transistor Q through an inductor therebetween. The collector of the transistor Q is connected to an output terminal RFo of a radio-frequency signal. An emitter of the transistor Q is grounded.

A radio-frequency signal is input to a base of the transistor Q through the DC cut capacitor C. A bias current is applied to the base through the ballast resistor R. FIGS. 13 and 14 each illustrate an example in which four HBT units 70 are connected in parallel. However, the number of HBT units 70 connected in parallel is not limited to four. In general, about ten HBT units 70 or more and about forty HBT units 70 or less are connected in parallel.

Next, advantageous effects of the power amplifier according to the sixth embodiment will be described.

The power amplifier according to the sixth embodiment includes transistors Q each having the same configuration as the transistor of the power amplifier module according to the second embodiment. Therefore, heat dissipation from heat-generating sources of the transistors Q can be efficiently performed.

Furthermore, in the sixth embodiment, the pad T0 for heat dissipation and the heat-conductive film T1 are disposed on an extension of the emitter electrode E0 in the longitudinal direction. Therefore, a total dimension of the plurality of HBT units 70 arranged in the width direction of the emitter electrode E0 can be reduced compared with the case where the configuration illustrated in FIG. 1A is adopted in which the pad T0 for heat dissipation and the heat-conductive film T1 are disposed on both sides of the emitter electrode E0.

Seventh Embodiment

Next, a power amplifier module according to a seventh embodiment will be described with reference to FIG. 15. The power amplifier module according to the seventh embodiment includes transistors Q each having the same configuration as the transistor (FIGS. 4, 5A, 5B, and 6) of the power amplifier module according to the third embodiment. Hereinafter, detailed descriptions of configurations of the transistors Q will be omitted.

Figure 15:
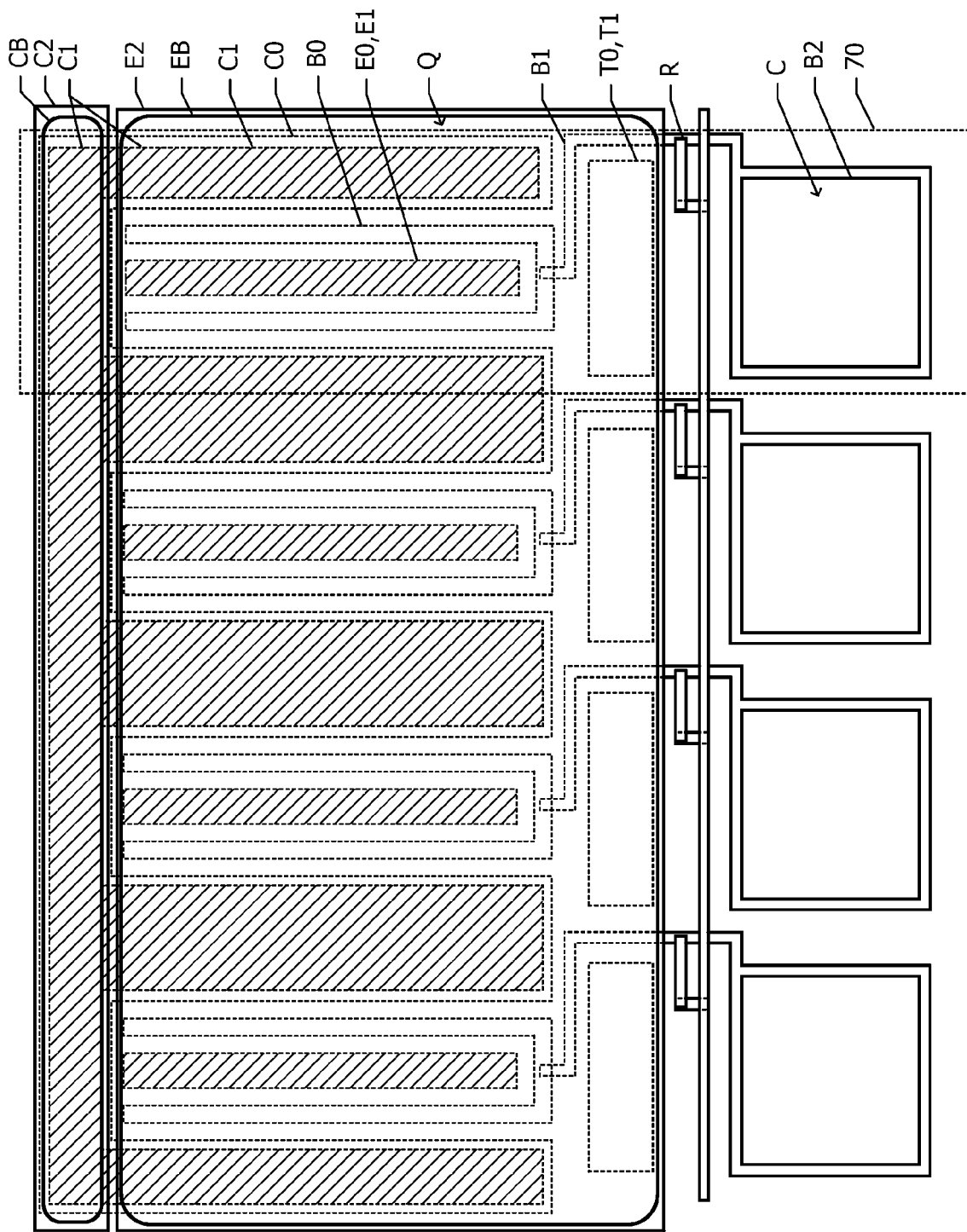
FIG. 15 is a plan view of a main part of an output-stage amplifier of a power amplifier module according to a seventh embodiment.

FIG. 15 is a plan view of a main part of an output-stage amplifier of a power amplifier module according to the seventh embodiment. In FIG. 15, components of a transistor Q are assigned with the same reference signs as those assigned to the corresponding components of the power amplifier module (FIG. 4) according to the third embodiment. A plurality of HBT units 70 are arranged side by side as in the sixth embodiment (FIG. 13). Each of the HBT units 70 includes a transistor Q, a ballast resistor R, and a DC cut capacitor C. The connection configuration of the transistor Q, the ballast resistor R, and the DC cut capacitor C is identical to that in the sixth embodiment.

A collector electrode C0 has a comb-tooth-like planar shape. Comb-tooth portions of the collector electrode C0 are disposed on both sides of each emitter electrode E0. Adjacent comb-tooth portions of two HBT units 70 adjacent to each other are integrated with each other in a continuous manner. A first-layer collector wiring line C1 substantially overlaps the collector electrode C0, and the first-layer collector wiring line C1 also has a comb-tooth-like planar shape.

In the seventh embodiment, a second-layer emitter wiring line E2 and an emitter bump EB are used in common by the plurality of HBT units 70 as in the sixth embodiment.

Next, advantageous effects of the power amplifier module according to the seventh embodiment will be described. The power amplifier module according to the seventh embodiment includes transistors Q each having the same configuration as the transistor of the power amplifier module according to the third embodiment. Therefore, heat dissipation from heat-generating sources of the transistors Q can be efficiently performed.

Modification of Seventh Embodiment

Next, a modification of the seventh embodiment will be described.

In the seventh embodiment, transistors each having the same configuration as the transistor of the power amplifier module according to the third embodiment are used as the transistors Q included in the HBT units 70. Alternatively, transistors each having the same configuration as the transistor (FIGS. 7A and 7B) of the power amplifier module according to the modification of the third embodiment may be used.

Eighth Embodiment

Next, a power amplifier module according to an eighth embodiment will be described with reference to FIG. 16. The power amplifier module according to the eighth embodiment includes transistors Q each having the same configuration as the transistor (FIGS. 8, 9A, 9B, and 10) of the power amplifier module according to the fourth embodiment. Hereinafter, detailed descriptions of configurations of the transistors Q will be omitted.

Figure 16:
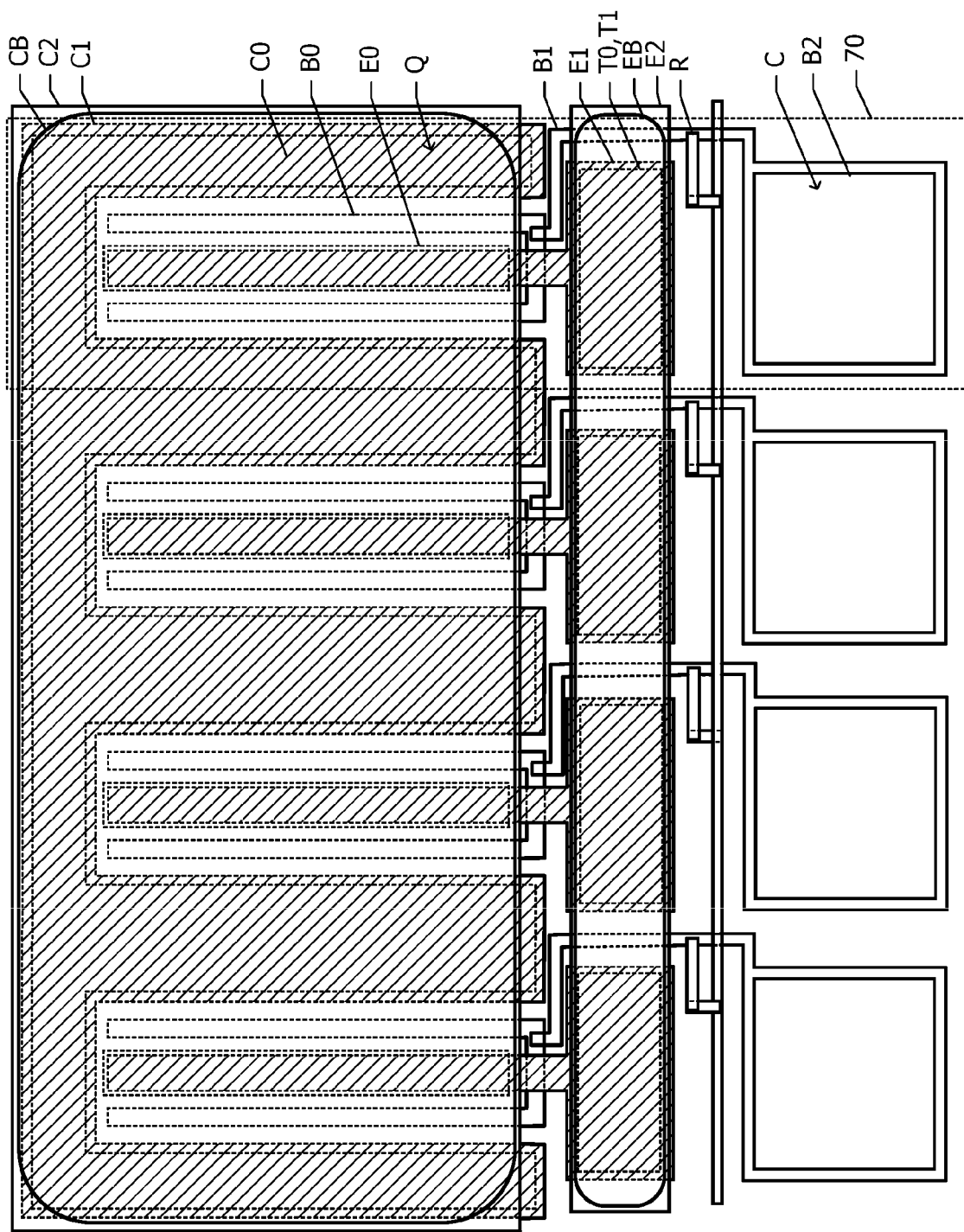
FIG. 16 is a plan view of a main part of an output-stage amplifier of a power amplifier module according to an eighth embodiment.

FIG. 16 is a plan view of a main part of an output-stage amplifier of a power amplifier module according to the eighth embodiment. In FIG. 16, components of a transistor Q are assigned with the same reference signs as those assigned to the corresponding components of the power amplifier module (FIG. 8) according to the fourth embodiment. A plurality of HBT units 70 are arranged side by side as in the sixth embodiment (FIG. 13). Each of the HBT units 70 includes a transistor Q, a ballast resistor R, and a DC cut capacitor C. The connection configuration of the transistor Q, the ballast resistor R, and the DC cut capacitor C is identical to that in the sixth embodiment.

A collector electrode C0 has a comb-tooth-like planar shape. Comb-tooth portions of the collector electrode C0 are disposed on both sides of each emitter electrode E0. Adjacent comb-tooth portions of two HBT units 70 adjacent to each other are integrated with each other in a continuous manner. A first-layer collector wiring line C1 substantially overlaps the collector electrode C0, and the first-layer collector wiring line C1 also has a comb-tooth-like planar shape.

A second-layer collector wiring line C2 and a collector bump CB are used in common by the plurality of HBT units 70. A second-layer emitter wiring line E2 and an emitter bump EB extend in a direction in which the plurality of HBT units 70 are arranged and are used in common by the plurality of HBT units 70.

Next, advantageous effects of the power amplifier module according to the eighth embodiment will be described. The power amplifier module according to the eighth embodiment includes transistors Q each having the same configuration as the transistor of the power amplifier module according to the fourth embodiment. Therefore, heat dissipation from heat-generating sources of the transistors Q can be efficiently performed.

Modification of Eighth Embodiment

Next, a modification of the eighth embodiment will be described.

In the eighth embodiment, transistors each having the same structure as the transistor of the power amplifier module according to the fourth embodiment are used as the transistors Q included in the HBT units 70. Alternatively, transistors each having the same configuration as the transistor (FIGS. 11A and 11B) of the power amplifier module according to the modification of the fourth embodiment may be used.

The embodiments described above are exemplary, and, needless to say, a partial replacement or combination of configurations described in different embodiments is possible. The same or similar advantageous effects achieved by the same or similar configurations in a plurality of embodiments will not be mentioned in each of the embodiments. Furthermore, the present disclosure is not limited to the embodiments described above. For example, it is obvious for those skilled in the art that various modifications, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier module comprising:
a substrate including, in an upper surface of the substrate, an electrically conductive active region and an insulating element isolation region adjacent to the active region;
a collector layer, a base layer, and an emitter layer that are sequentially stacked on the active region;
a collector electrode that partially overlaps the active region in plan view and is electrically connected to the active region;
an interlayer insulating film that covers the collector layer, the base layer, the emitter layer, and the collector electrode; and
a collector bump that is disposed on the interlayer insulating film, is electrically connected to the collector electrode through a via hole provided in the interlayer insulating film, and, in plan view, partially overlaps an emitter region which is a region of the emitter layer and through which an emitter current flows.

2. The power amplifier module according to claim 1, wherein a thermal conductivity of at least part of the interlayer insulating film in a region where the emitter region and the collector bump overlap is higher than a thermal conductivity of the interlayer insulating film in other regions.

3. The power amplifier module according to claim 2, further comprising:
a pad that is thermally coupled to the element isolation region; and
an emitter bump that is disposed on the interlayer insulating film, is electrically connected to the emitter layer, and partially overlaps the pad in plan view,
wherein the emitter bump is electrically connected to the pad through another via hole provided in the interlayer insulating film.

4. The power amplifier module according to claim 1, further comprising:
a pad that is thermally coupled to the element isolation region; and
an emitter bump that is disposed on the interlayer insulating film, is electrically connected to the emitter layer, and partially overlaps the pad in plan view,
wherein the emitter bump is electrically connected to the pad through another via hole provided in the interlayer insulating film.

5. The power amplifier module according to claim 4, further comprising:
a module substrate on which a chip including the substrate is mounted,
wherein the module substrate has
a first land that is disposed on a first surface and electrically connected to the emitter bump,
a second land that is disposed on the first surface and electrically connected to the collector bump,
a third land disposed on a second surface opposite to the first surface,
a via conductor that extends from the first surface to the second surface and electrically connects the first land to the third land, and
an inner-layer conductor that is disposed as an inner layer to be electrically connected to the via conductor and that partially overlaps the second land.

6. The power amplifier module according to claim 5, wherein a thermal conductivity of at least part of an insulating film between the inner-layer conductor and the second land in a region where the inner-layer conductor and the second land overlap is higher than a thermal conductivity of an insulating portion in other regions of the module substrate.

* * * * *